(12) United States Patent
Dodge et al.

(10) Patent No.: US 8,211,742 B2
(45) Date of Patent: Jul. 3, 2012

(54) LATERAL PHASE CHANGE MEMORY

(75) Inventors: Richard Dodge, Santa Clara, CA (US); Guy Wicker, Southfield, MI (US)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/883,086

(22) Filed: Sep. 15, 2010

(65) Prior Publication Data

US 2011/0003454 A1    Jan. 6, 2011

Related U.S. Application Data

(62) Division of application No. 11/399,297, filed on Apr. 6, 2006, now Pat. No. 7,816,660.

(30) Foreign Application Priority Data

Apr. 8, 2005 (EP) .................................... 05102814

(51) Int. Cl.
*H01L 21/06* (2006.01)

(52) U.S. Cl. .............. 438/102; 438/637; 257/5; 257/42; 257/E21.068; 257/E27.004; 257/E45.002

(58) Field of Classification Search .................. 438/102, 438/637; 257/4, 5, 42, E27.004, E45.002, 257/E21.068
See application file for complete search history.

(56) References Cited

U.S. PATENT DOCUMENTS

| | | | |
|---|---|---|---|
| 3,619,732 A | 11/1971 | Neale | 317/234 R |
| 4,115,872 A | 9/1978 | Bluhm | 365/163 |
| 4,203,123 A | 5/1980 | Shanks | 357/2 |
| 5,166,758 A | 11/1992 | Ovshinsky et al. | 257/3 |
| 6,744,088 B1 * | 6/2004 | Dennison | 257/296 |
| 6,773,967 B1 | 8/2004 | Liu | 438/131 |
| 7,696,077 B2 * | 4/2010 | Liu | 438/597 |
| 2003/0001230 A1 * | 1/2003 | Lowrey | 257/529 |
| 2003/0116794 A1 | 6/2003 | Lowrey | 257/296 |
| 2004/0113181 A1 | 6/2004 | Wicker | 257/246 |
| 2004/0113232 A1 | 6/2004 | Johnson et al. | 257/529 |
| 2004/0165422 A1 | 8/2004 | Hideki et al. | 365/163 |

FOREIGN PATENT DOCUMENTS

| | | |
|---|---|---|
| EP | 1 339 110 A1 | 8/2003 |
| WO | WO 00/57498 | 9/2000 |

* cited by examiner

*Primary Examiner* — Mary Wilczewski
*Assistant Examiner* — Toniae Thomas
(74) *Attorney, Agent, or Firm* — Seed IP Law Group PLLC

(57) ABSTRACT

A lateral phase change memory includes a pair of electrodes separated by an insulating layer. The first electrode is formed in an opening in an insulating layer and is cup-shaped. The first electrode is covered by the insulating layer which is, in turn, covered by the second electrode. As a result, the spacing between the electrodes may be very precisely controlled and limited to very small dimensions. The electrodes are advantageously formed of the same material, prior to formation of the phase change material region.

24 Claims, 18 Drawing Sheets

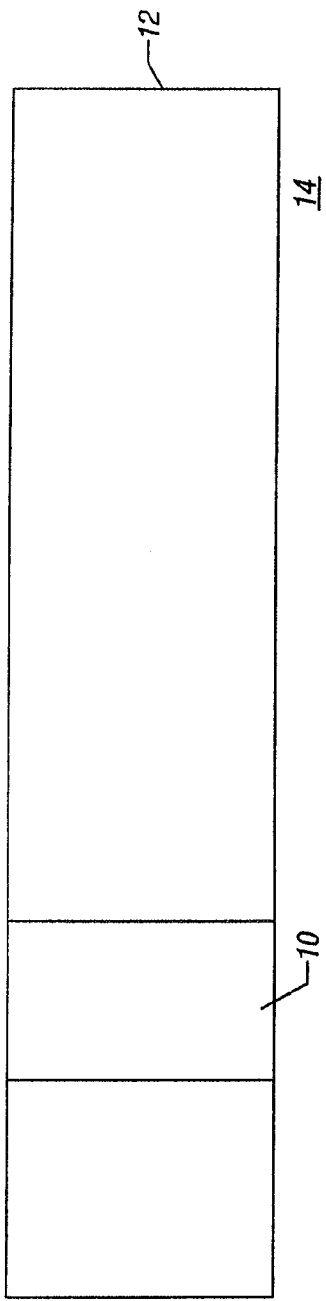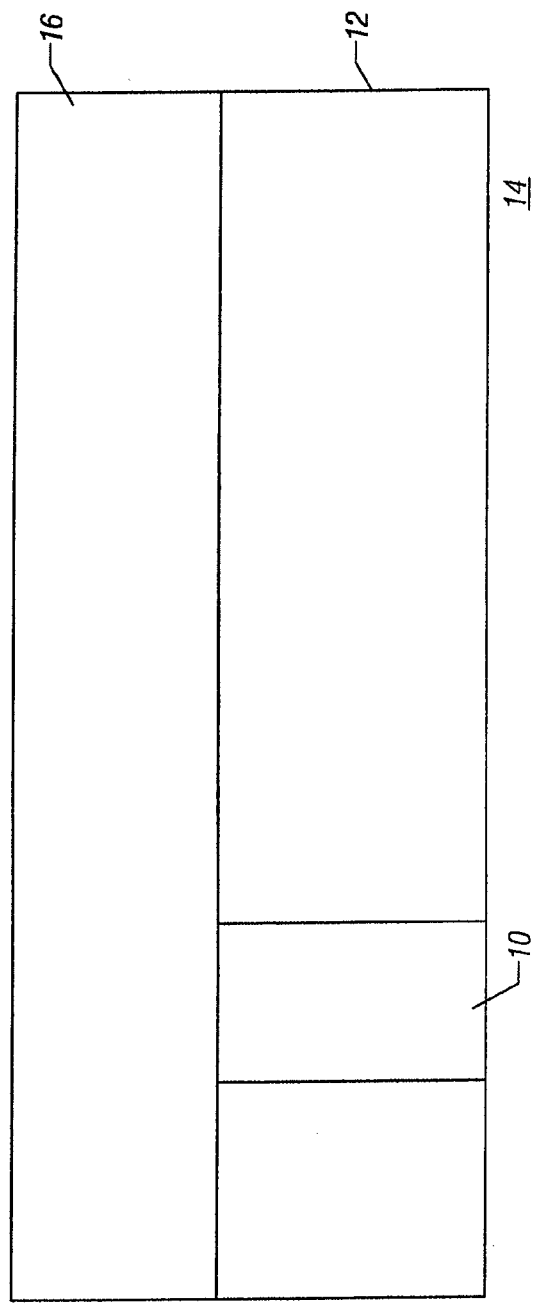
FIG. 2
FIG. 3

LATERAL PHASE CHANGE MEMORY

BACKGROUND OF THE INVENTION

1. Field of the Invention

The present invention relates generally to semiconductor memories and, in particular, to a lateral phase change memory.

2. Description of the Related Art

Phase change memory devices use phase change materials, i.e., materials that may be electrically switched between a generally amorphous and a generally crystalline state, as an electronic memory. One type of memory element utilizes a phase change material that is electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile, absent application of excess temperatures, such as those in excess of 150° C. for extended times. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

Prior art phase change memories have a vertical structure including a stack of an upper electrode, a phase change material region, and a lower electrode. Because of the presence of the intervening phase change material region and the fact that the upper electrode is formed on the phase change material region, the electrodes are made of different materials. More particularly, the top electrode is made using low temperatures to avoid adverse effects on the phase change material region when the upper electrode is deposited. However, the use of different materials for the upper and lower electrodes may result in various disadvantages.

Therefore, there is a need for better phase change memories.

BRIEF SUMMARY OF THE INVENTION

One embodiment of the invention provides a phase change memory having a structure that allows, if desired, to form electrodes of the same material.

One embodiment of the invention is a method of making a phase change memory. The method includes: forming first and second spaced electrodes having substantially co-planar surfaces; and forming a phase change material region on said surfaces.

Another embodiment of the invention is a phase change memory that includes: a phase change material region having a substantially planar surface; and a pair of spaced electrodes that are arranged in an abutting position with respect to said surface.

BRIEF DESCRIPTION OF THE SEVERAL VIEWS OF THE DRAWINGS

For the understanding of the present invention, a preferred embodiment is now described, purely as a non-limitative example, with reference to the enclosed drawings, wherein:

FIGS. 2-11 are enlarged, cross-sectional views of the embodiment shown in FIG. 1 at subsequent stages of manufacture;

DETAILED DESCRIPTION OF THE INVENTION

Figure 1:
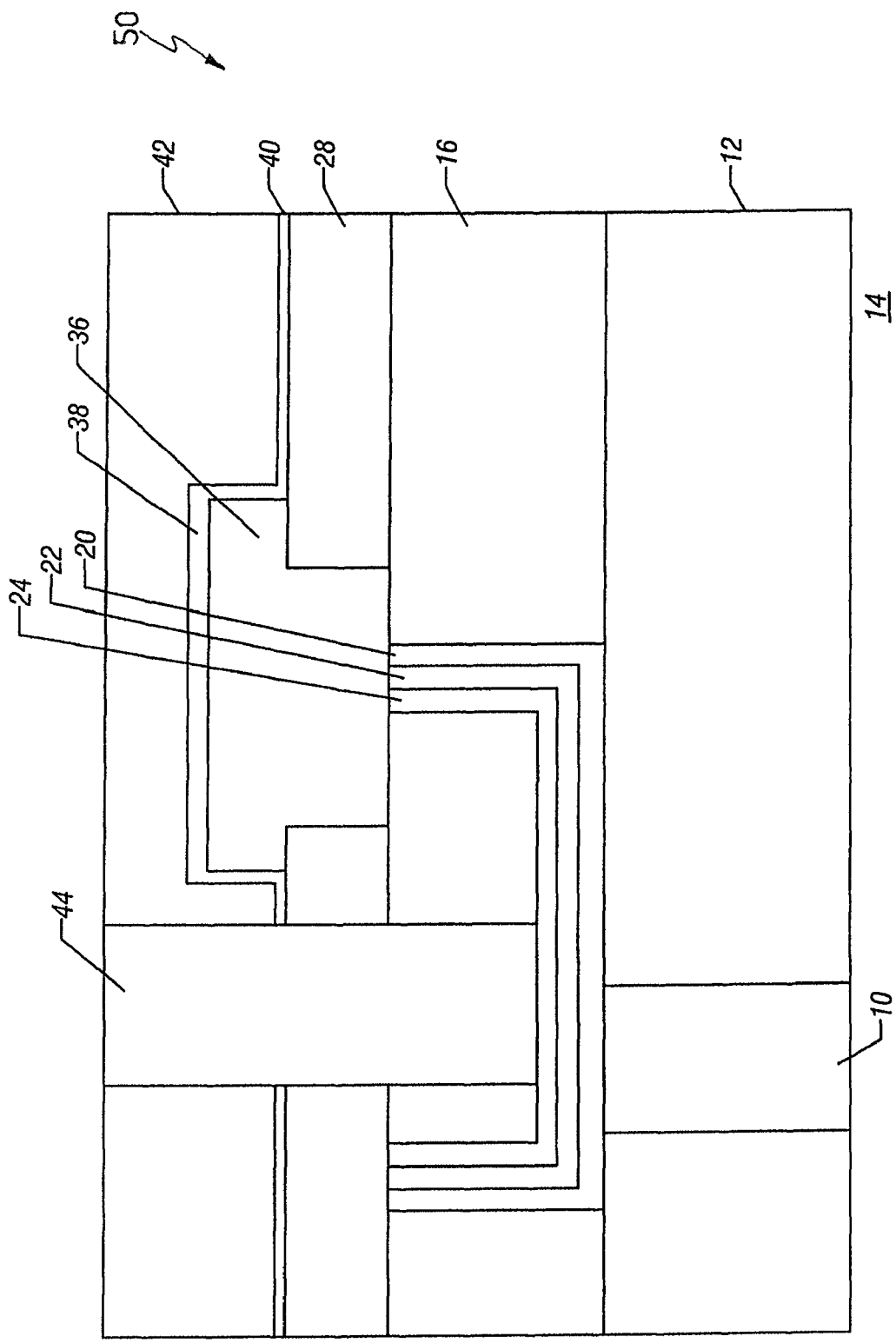
FIG. 1 is an enlarged, cross-sectional view through one embodiment of the present invention.

Referring to FIG. 1, a lateral phase change memory 50 includes a pair of electrodes 20 and 24 spaced by an intervening insulator 22. The electrodes 20 and 24 and the intervening insulator 22 are cup-shaped or U-shaped. The spacing between the electrodes 20 and 24 is determined by the thickness of the insulator 22, which can be precisely controlled and may be very thin. As a result, the threshold voltage of the device 50 may be relatively low.

An upper contact 44 makes contact to the upper electrode 24 and a lower contact 10 makes contact to the lower electrode 20. A phase change material region 36 is completely encapsulated in insulators 38, 42, 40, 28 and 16. An oxide layer 12 underlies the insulator 16.

In FIG. 1, the electrodes 20 and 24 are made symmetrically. In particular, they may be made of the same material. Here, both electrodes 20, 24 are deposited before the phase change material 36 deposition and, thus, the electrodes 20, 24 can be prepared at an elevated temperature, which will stabilize their behaviors. Furthermore, advantageously, the phase change material 36 can be etched and encapsulated without consideration of the top contact, thus, reducing processing before encapsulation. Moreover, advantageously, the region of programmed material (here the phase change material region 36) may be completed surrounded by thermal insulators, except for the electrodes 20, 24, which can be a sidewall with limited contact and which may yield significantly lower power consuming memory elements. Still another advantage is that both electrodes 20, 24 may contribute equally to the heating of the phase change material 36, increasing the efficiency of heating.

Referring to FIG. 2, initially, an oxide layer 12 (or other insulating layer) is deposited over a semiconductor substrate 14. Using conventional via formation techniques, a vertical contact 10 is formed, extending through the layer 12, down to the substrate 14. For example, the contact 10 is a tungsten contact. It may make contact to buried contacts (not shown) formed in the substrate 14. As another option, the contact 10 may connect to metal address lines (not shown) which are formed as part of the substrate 14.

Figure 4:
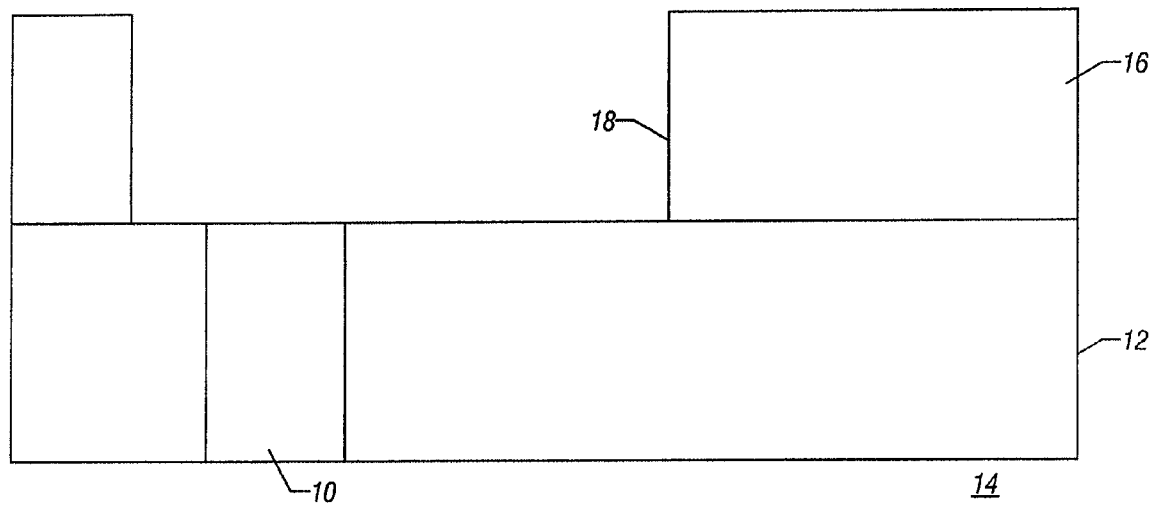

Referring to FIG. 3, another oxide layer 16 (or other insulating layer) is deposited over the layer 12 and the contact 10. Then, as shown in FIG. 4, an opening 18 is formed through the layer 16 down to the layer 12 and the contact 10.

Figure 5:
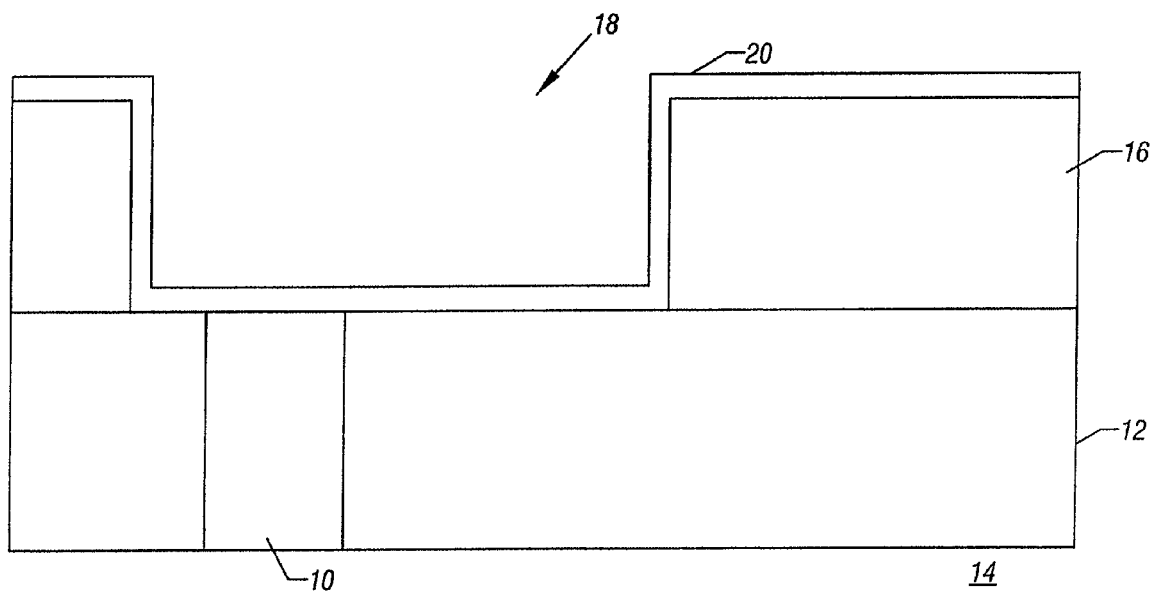

The lower electrode 20 is then deposited into the opening 18 and over the layer 16 as shown in FIG. 5. The electrode 20 may, for example, be formed of a thin film material having a thickness ranging from about 20 to about 2000 Angstroms. For example, the thickness of the electrode 20 is about 50 Angstroms. Suitable materials for the electrode 20 include a thin film of titanium, titanium nitride, titanium tungsten, carbon, silicon carbide, titanium aluminum nitride, titanium silicon nitride, polycrystalline silicon, tantalum nitride, some combination of these films, or other suitable conductors or resistive conductors.

Figure 6:
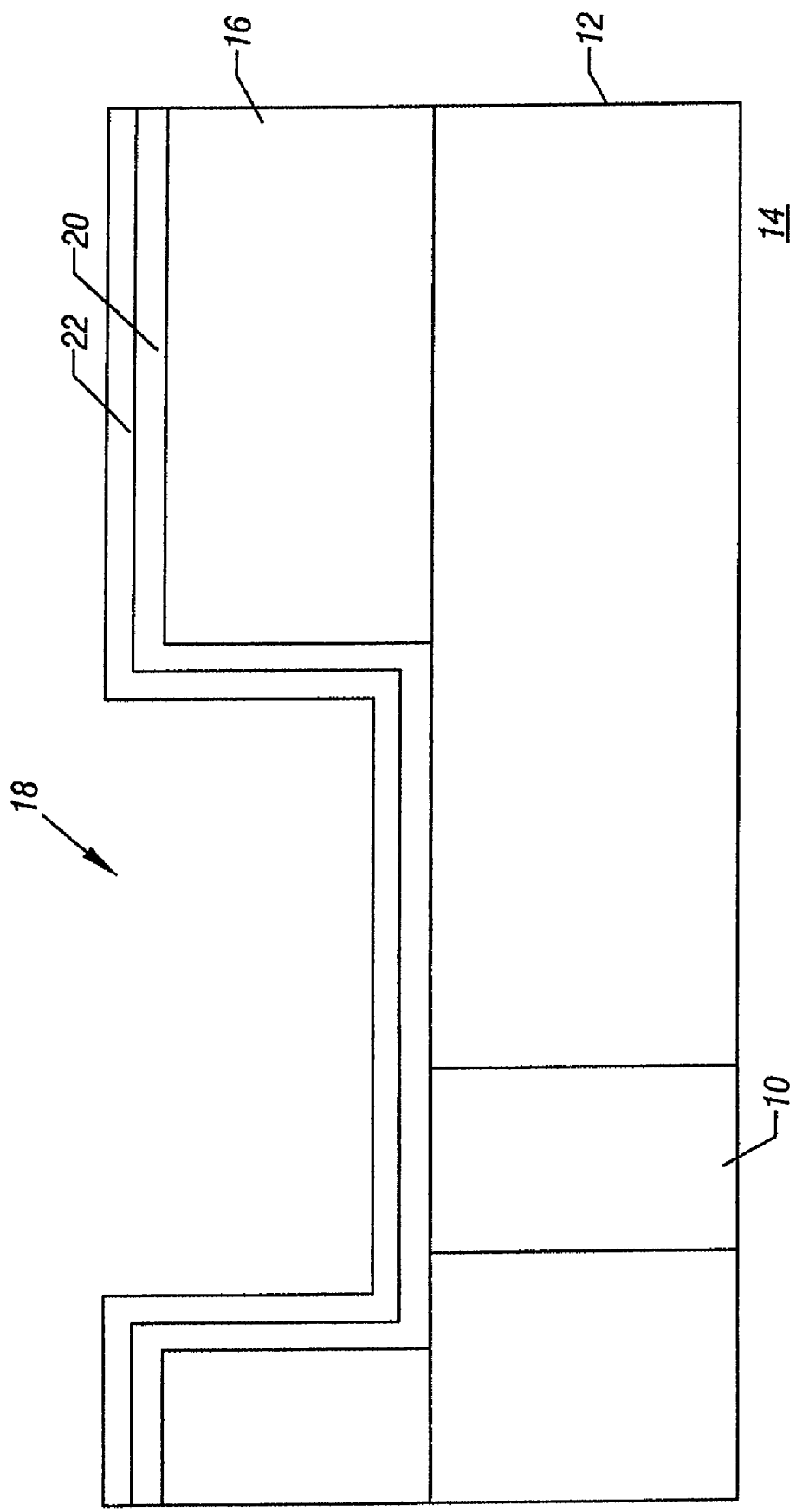

Turning to FIG. 6, an insulator 22 is then deposited over the lower electrode 20. The insulator 22 may be nitride. The thickness of the insulator 22 may be less than 500 Angstroms, for example about 200 Angstroms. Other insulating materials and thicknesses may be utilized as well.

Figure 7:
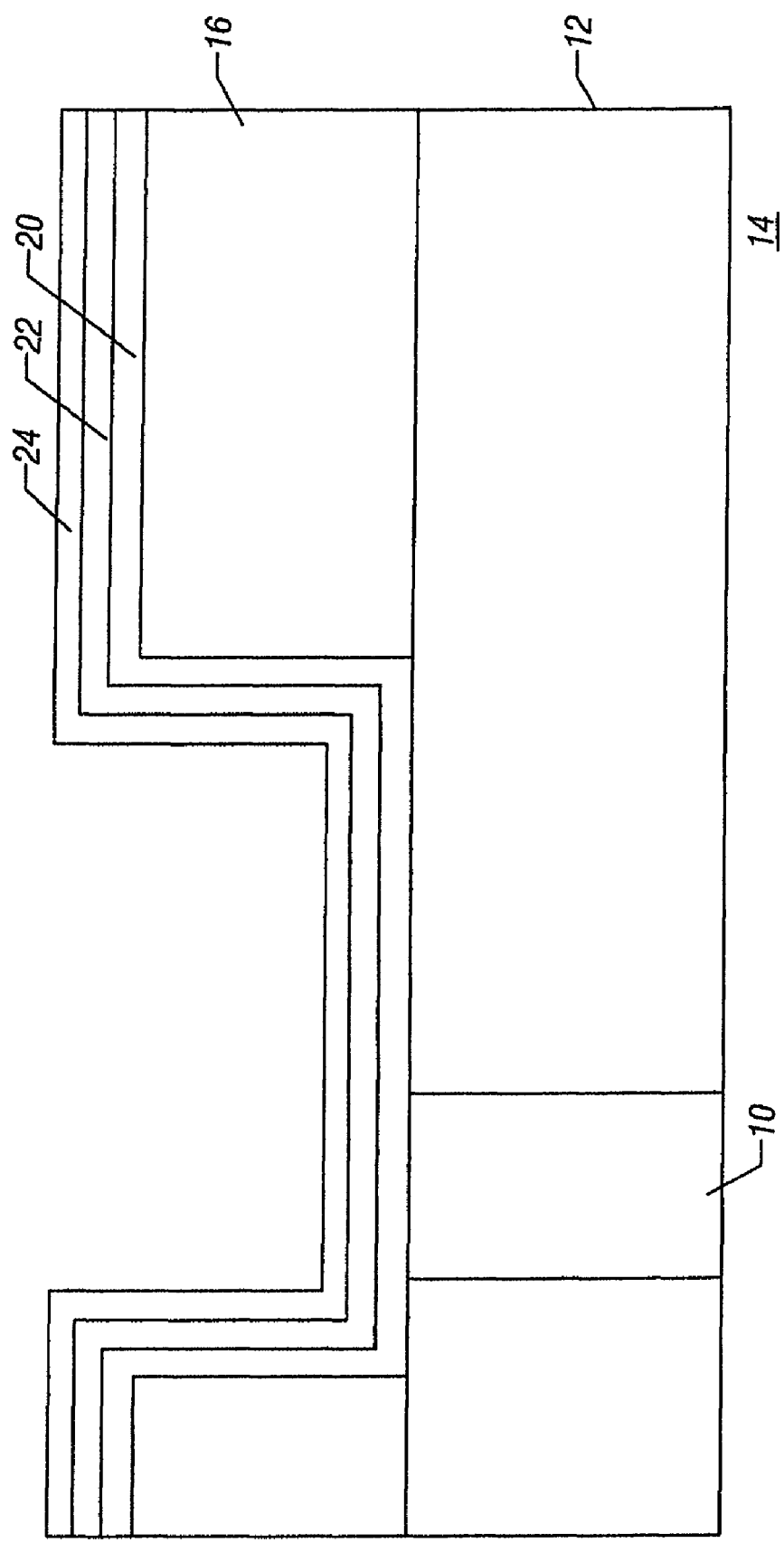
Figure 8:
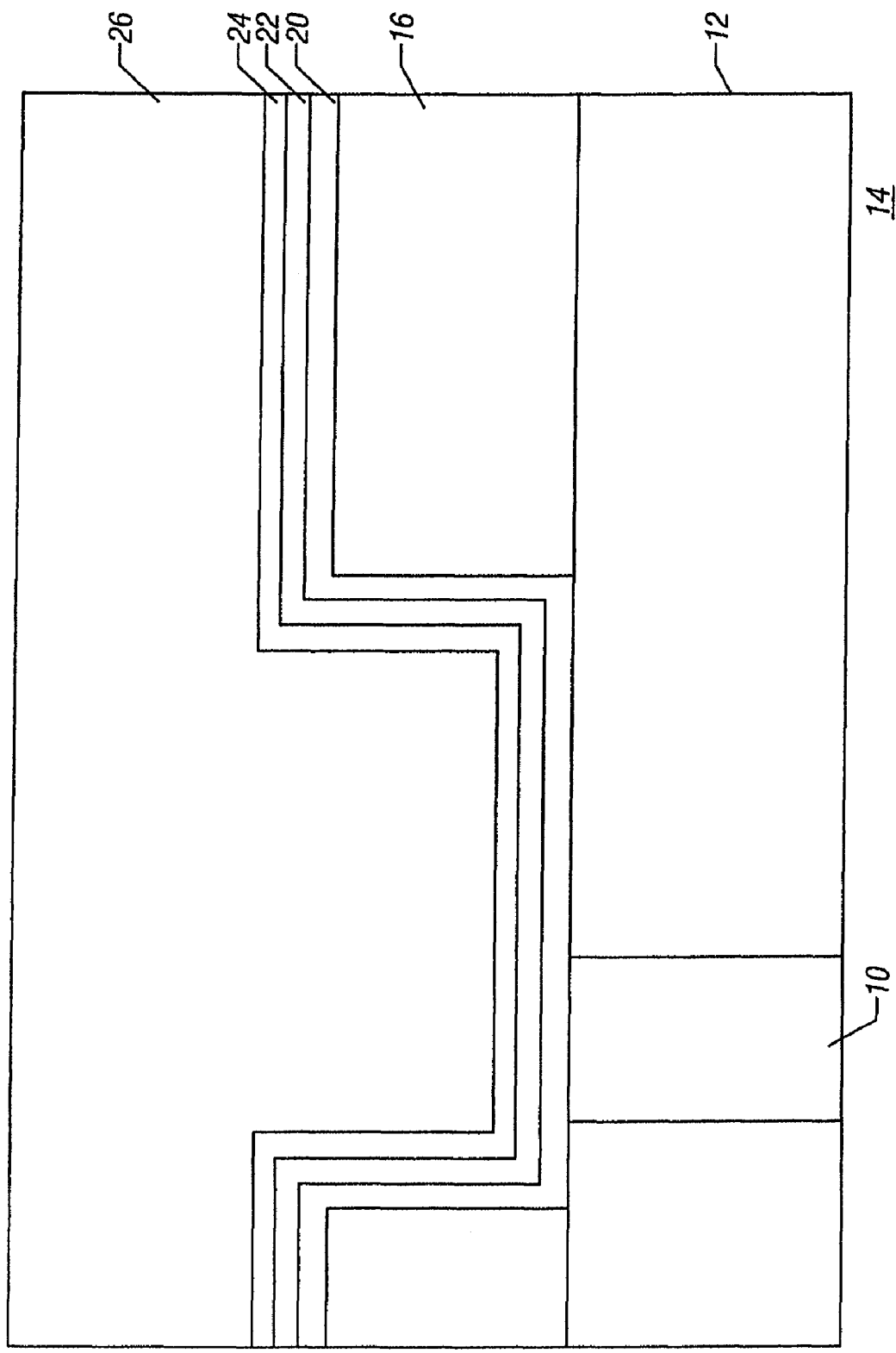

Then, referring to FIG. 7, the upper electrode 24 is deposited. The upper electrode 24 may be made of the same material as the lower electrode 20. Referring to FIG. 8, a high density plasma (HDP) oxide 26 is then deposited over the entire structure. The oxide 26 is subjected to chemical mechanical planarization (CMP) as shown in FIG. 9.

Figure 9:
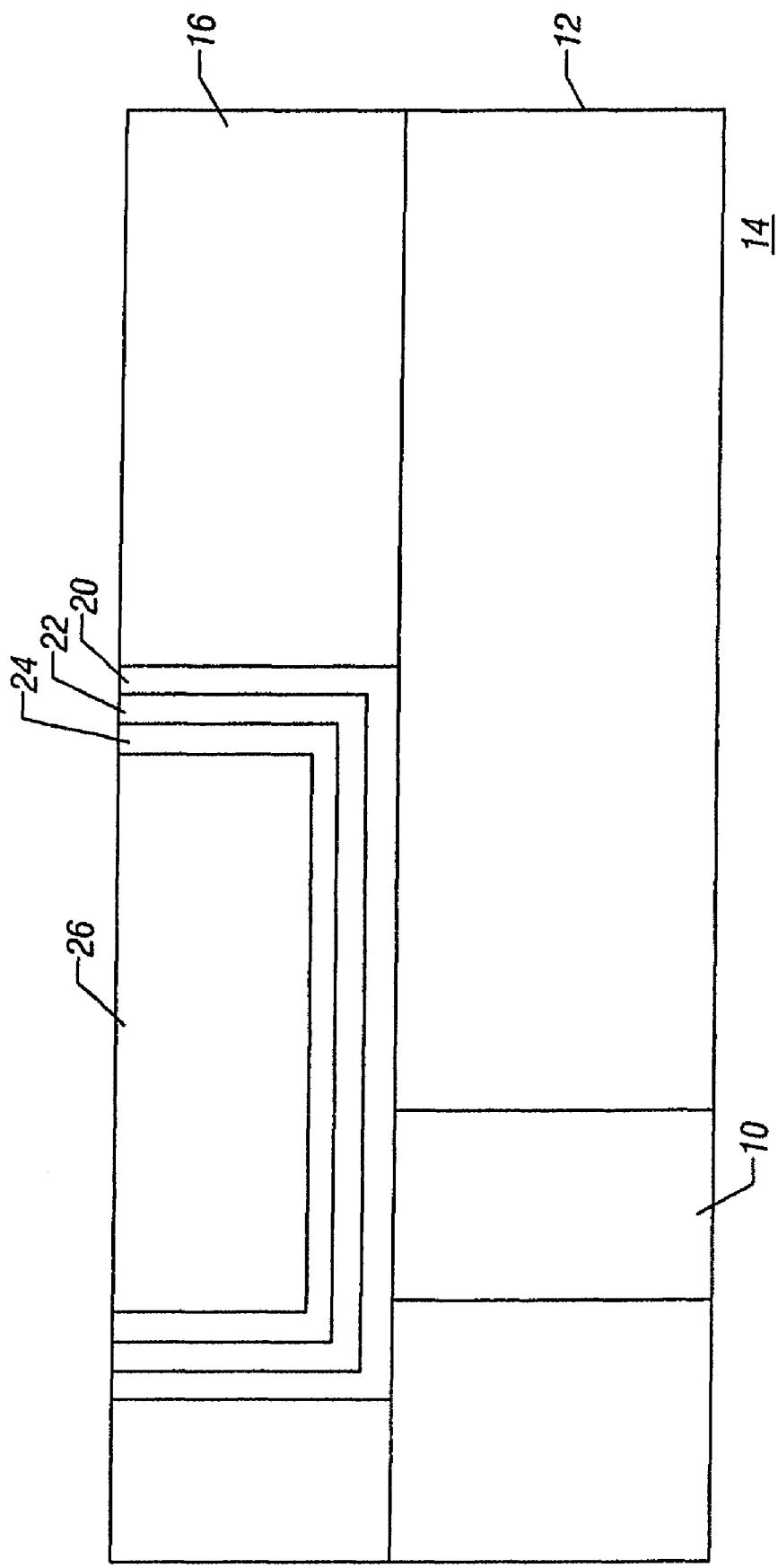
Figure 10:
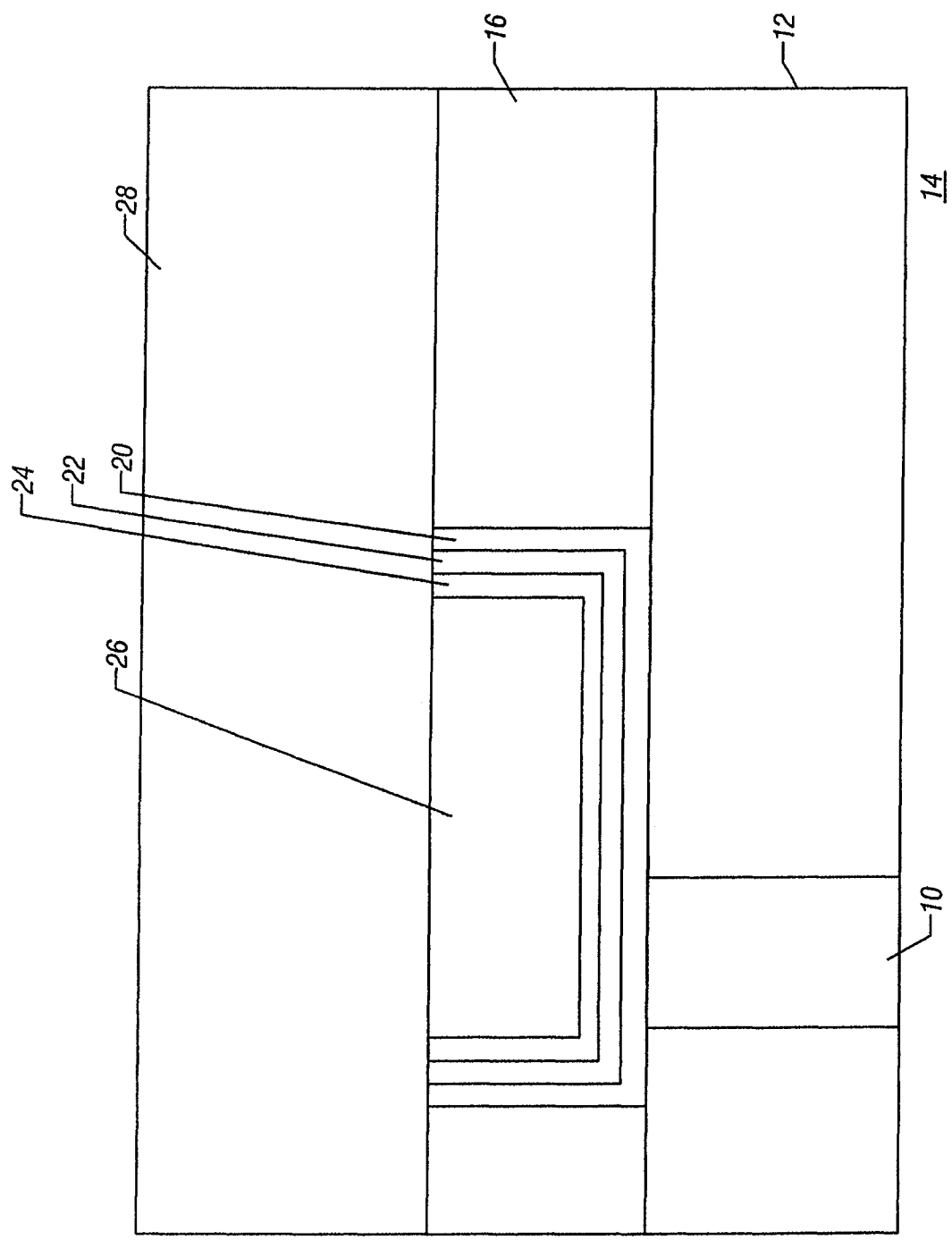
Figure 11:
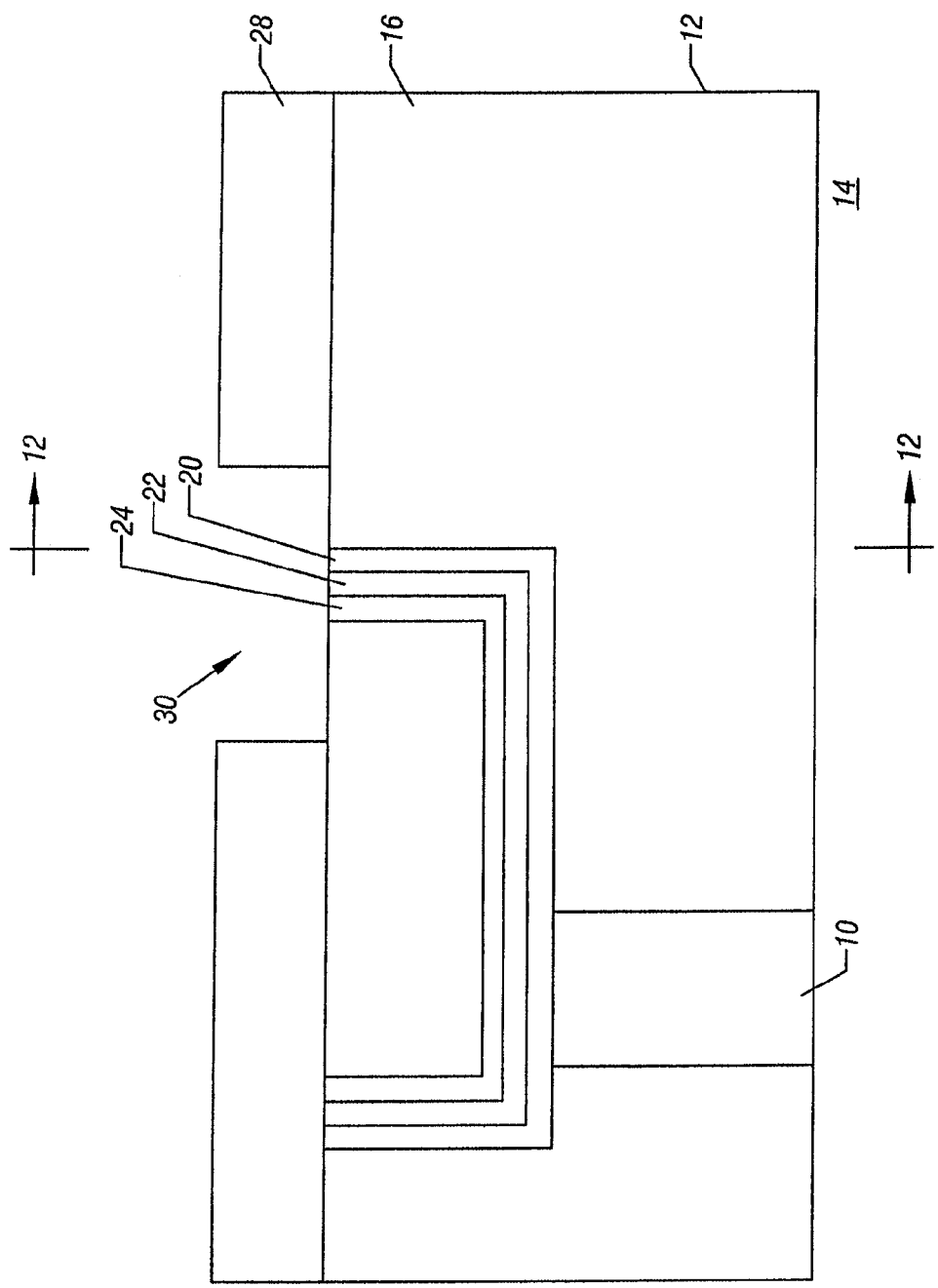
Figure 12:
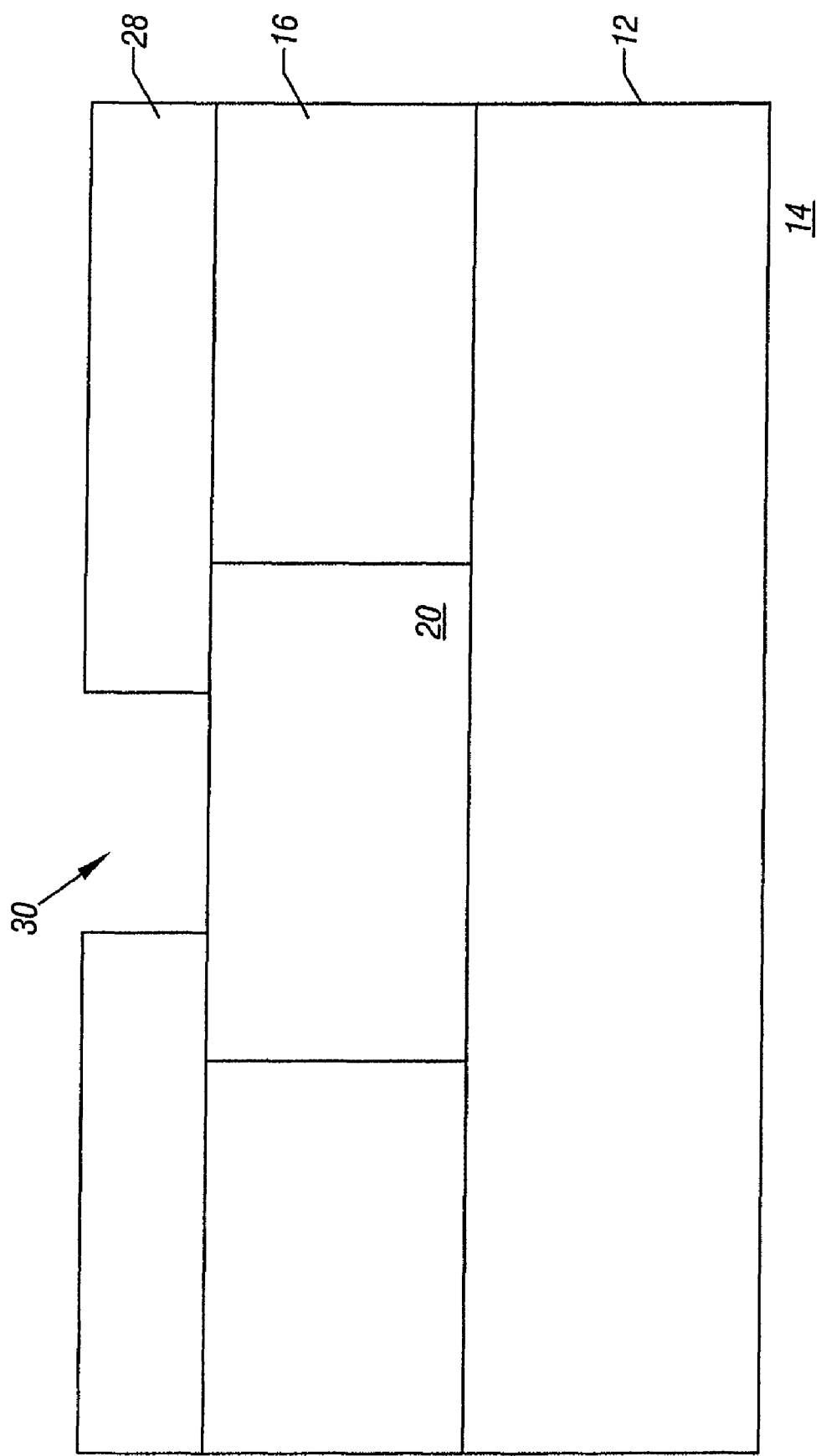
FIGS. 12-17 are cross-sectional views, taken along line 12-12 of FIG. 11, at subsequent stages of manufacture.

Then, another oxide layer 28 is deposited over the planarized structure of FIG. 9, as shown in FIG. 10. A microtrench 30 is then etched into the layer 28 (whose thickness is reduced by the microtrenching process), as shown in FIG. 11. As shown in FIG. 12, the lower electrode 20 and, particularly, the vertical portion thereof is situated below the microtrench 30.

Figure 13:
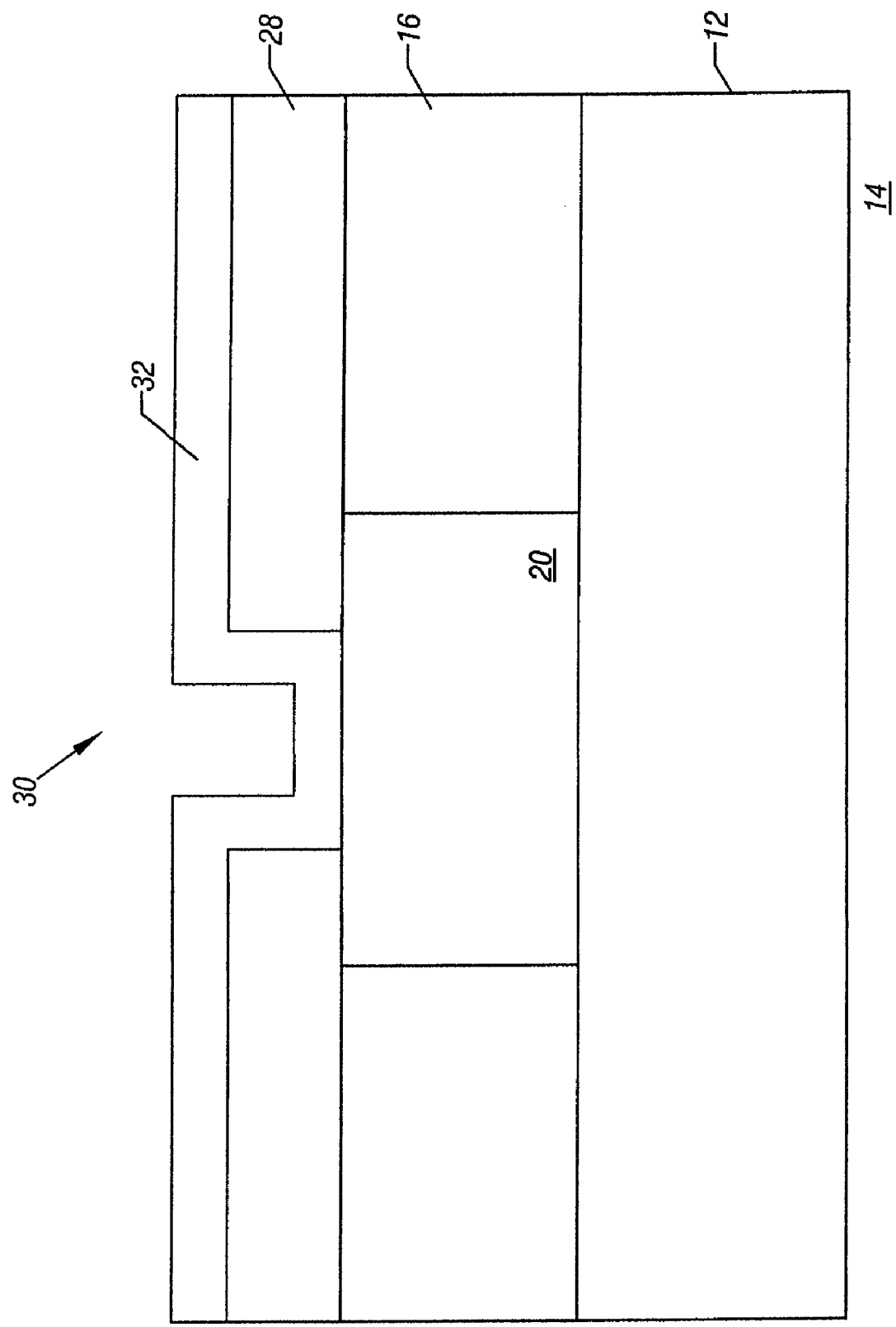
Figure 14:
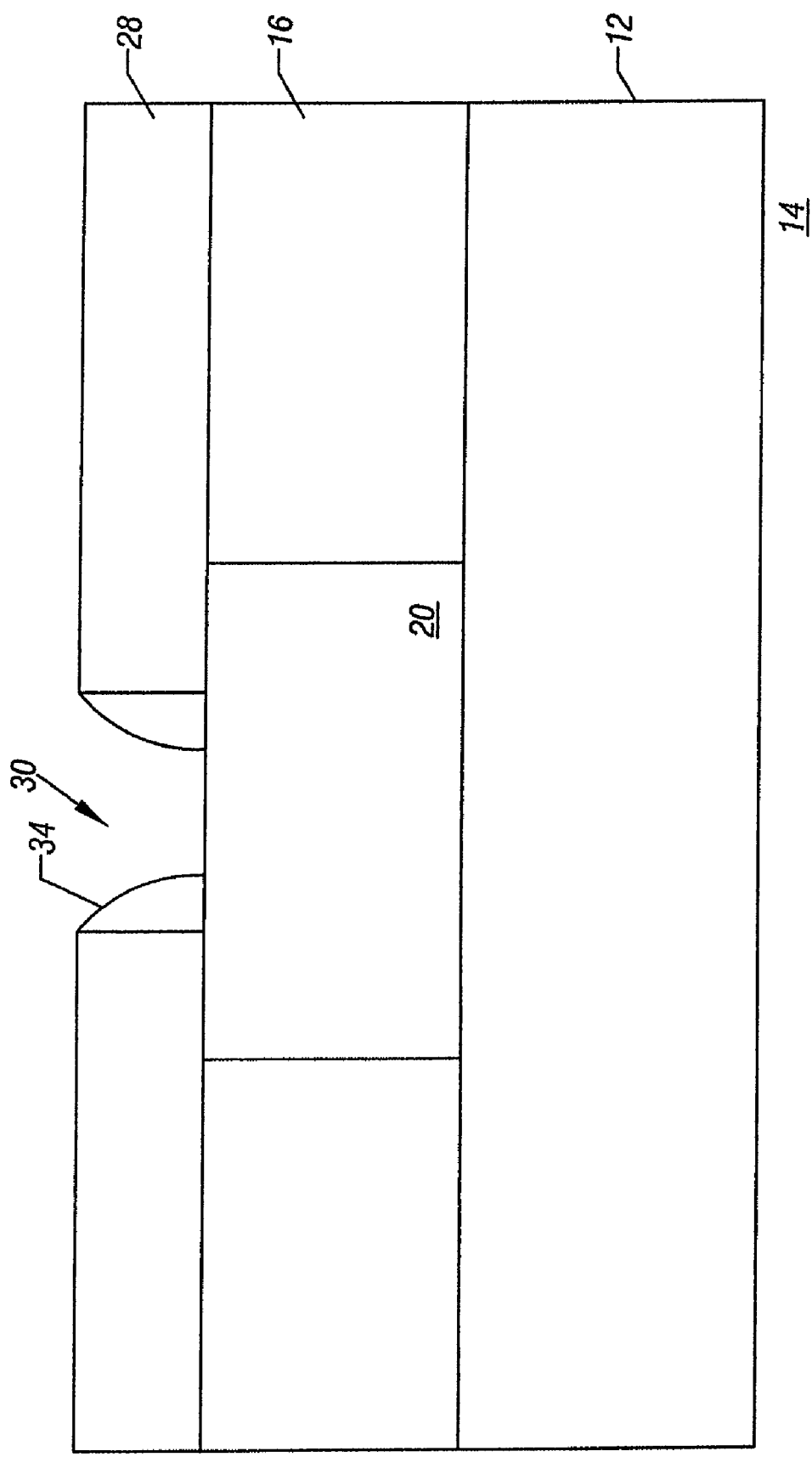

As shown in FIG. 13, a spacer layer 32 of any suitable spacer material is deposited. Then, as shown in FIG. 14, sidewall spacers 34 are defined using an anisotropic etching process, for example.

Figure 15:
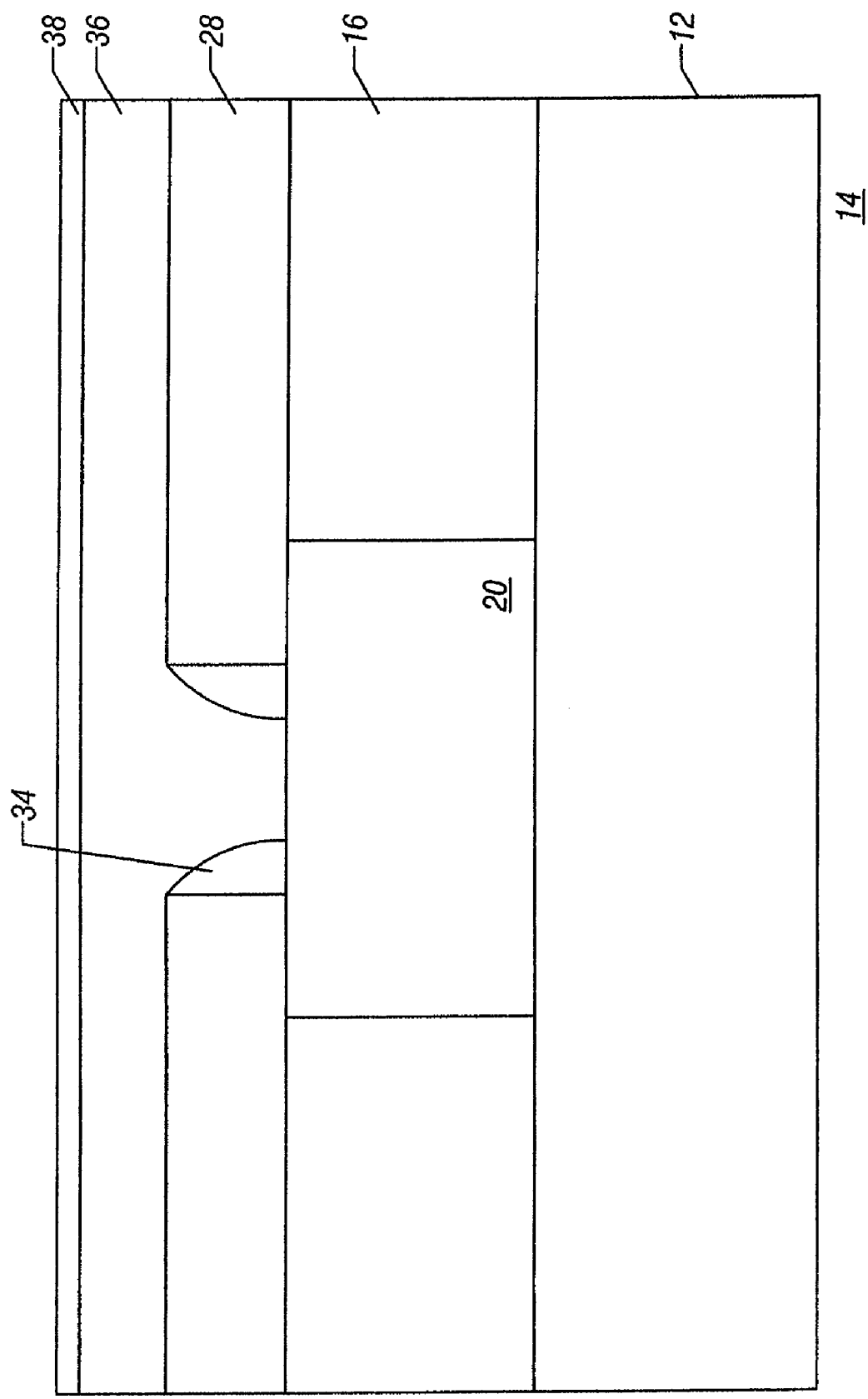

As shown in FIG. 15, the phase change material 36 is deposited so as to fill the microtrench 30 and to overlie the layer 28. Thus, the deposition of the phase change material 36 advantageously occurs after the deposition of the electrodes 20 and 24. As a result, higher temperature deposition processes may be used to form the electrodes 20 and 24. In the discussed embodiment, the phase change material 36 is in contact with the electrodes 20, 24; alternatively, the phase change material 36 may be in electrical connection with the electrodes 20, 24 through a conductive intervening layer (not shown).

In the considered embodiment, the phase change material 36 includes a chalcogenide material. A chalcogenide material is a material that includes at least one element from column VI of the periodic table or a material that includes one or more of the chalcogen elements, e.g., any of the elements of tellurium, sulfur, or selenium. Chalcogenide materials are non-volatile memory materials that may be used to store information that is retained even after the electrical power is removed.

In particular, the phase change material may be a chalcogenide element composition from the class of tellurium-germanium-antimony ($Te_xGe_ySb_z$) material or a GeSbTe alloy, such as 2,2,5, although the scope of the present invention is not limited to just these materials.

Figure 16:
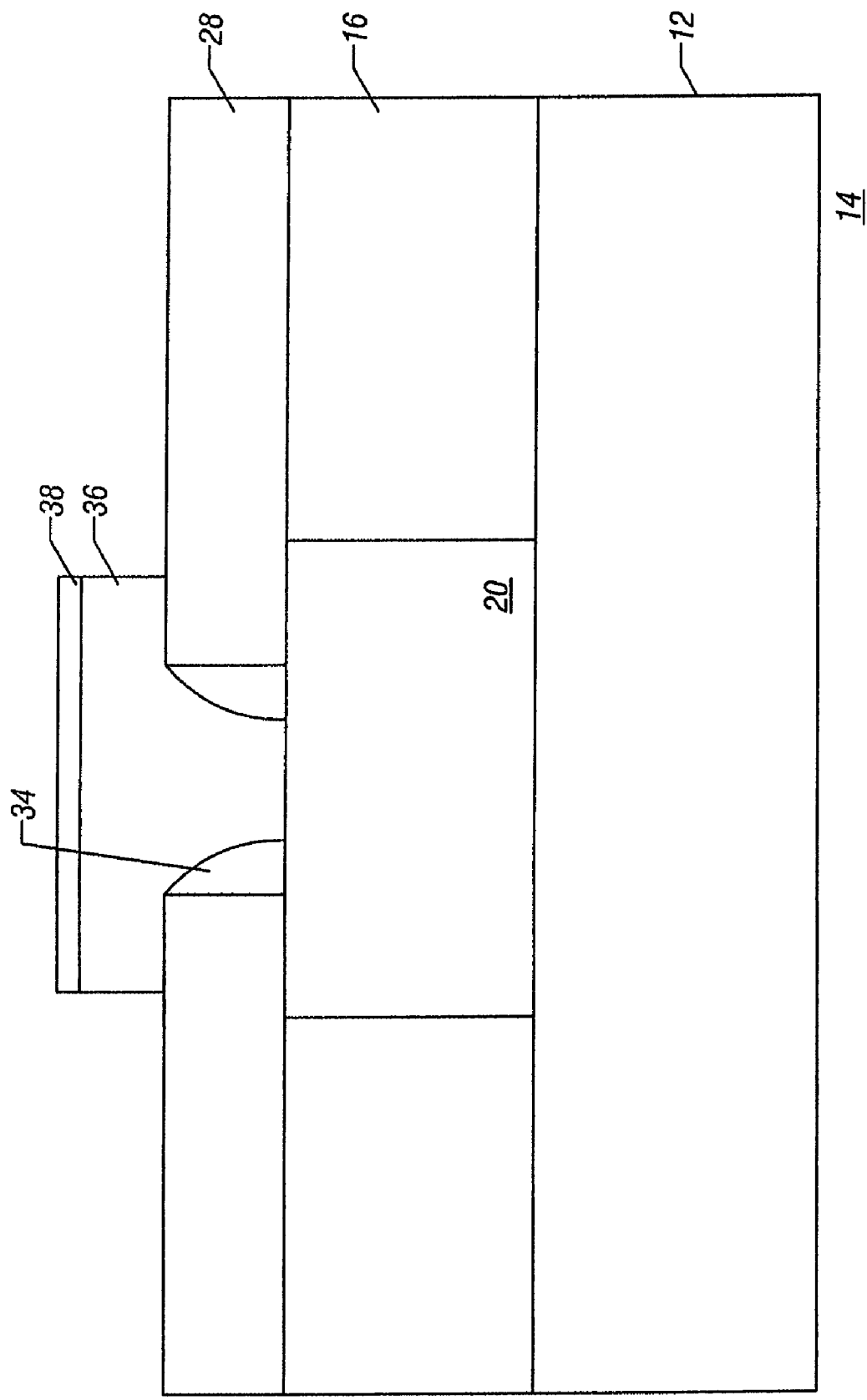

A first cap layer 38 is formed thereover. The first cap layer 38 is, e.g., composed of nitrogen-doped titanium aluminum. The first cap layer 38 functions to encapsulate the phase change material 36 to prevent poisoning or sublimation as a result of ensuing processing. As shown in FIG. 16, the first cap layer 38 and phase change material 36 are then patterned and etched.

Figure 17:
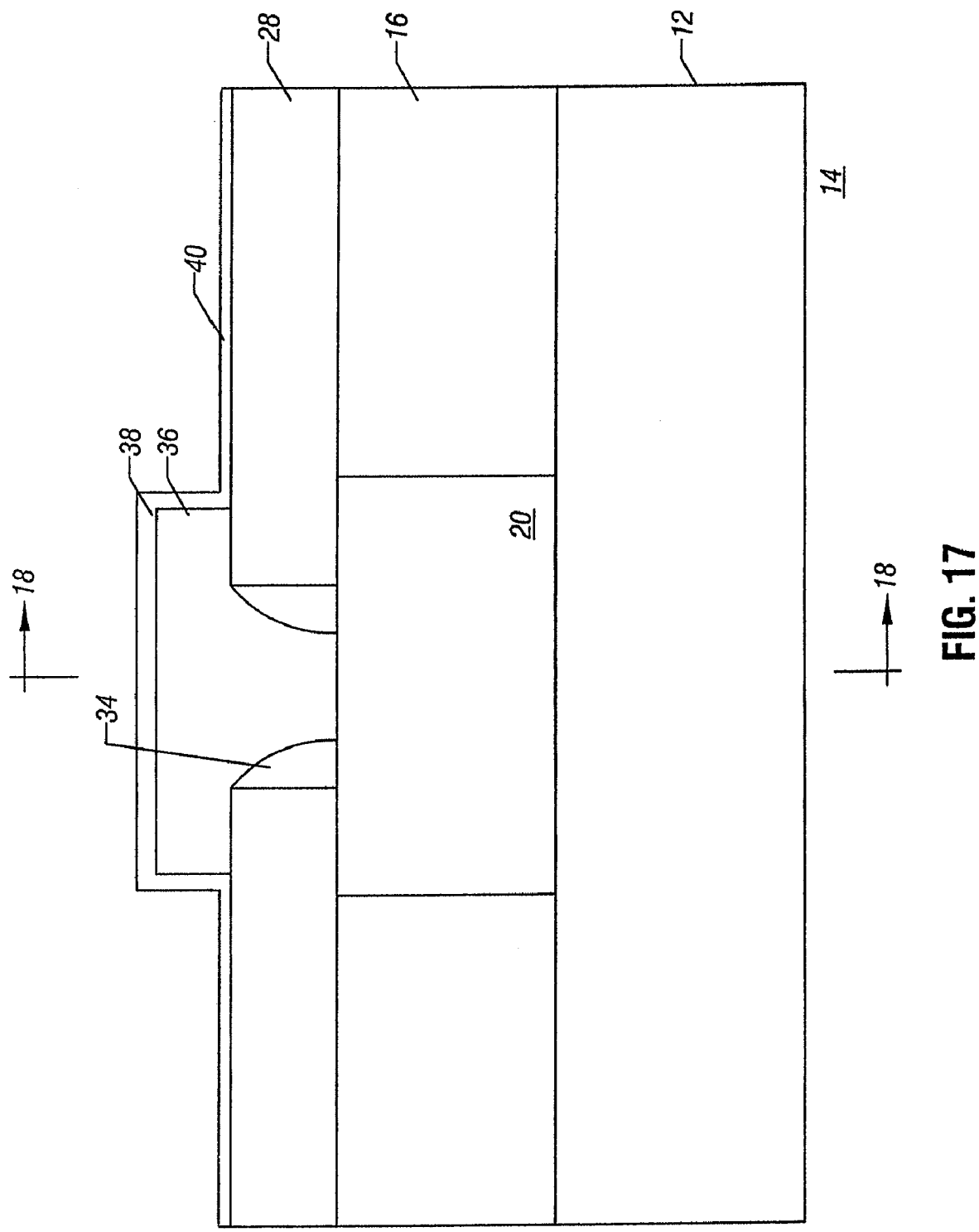
Figure 18:
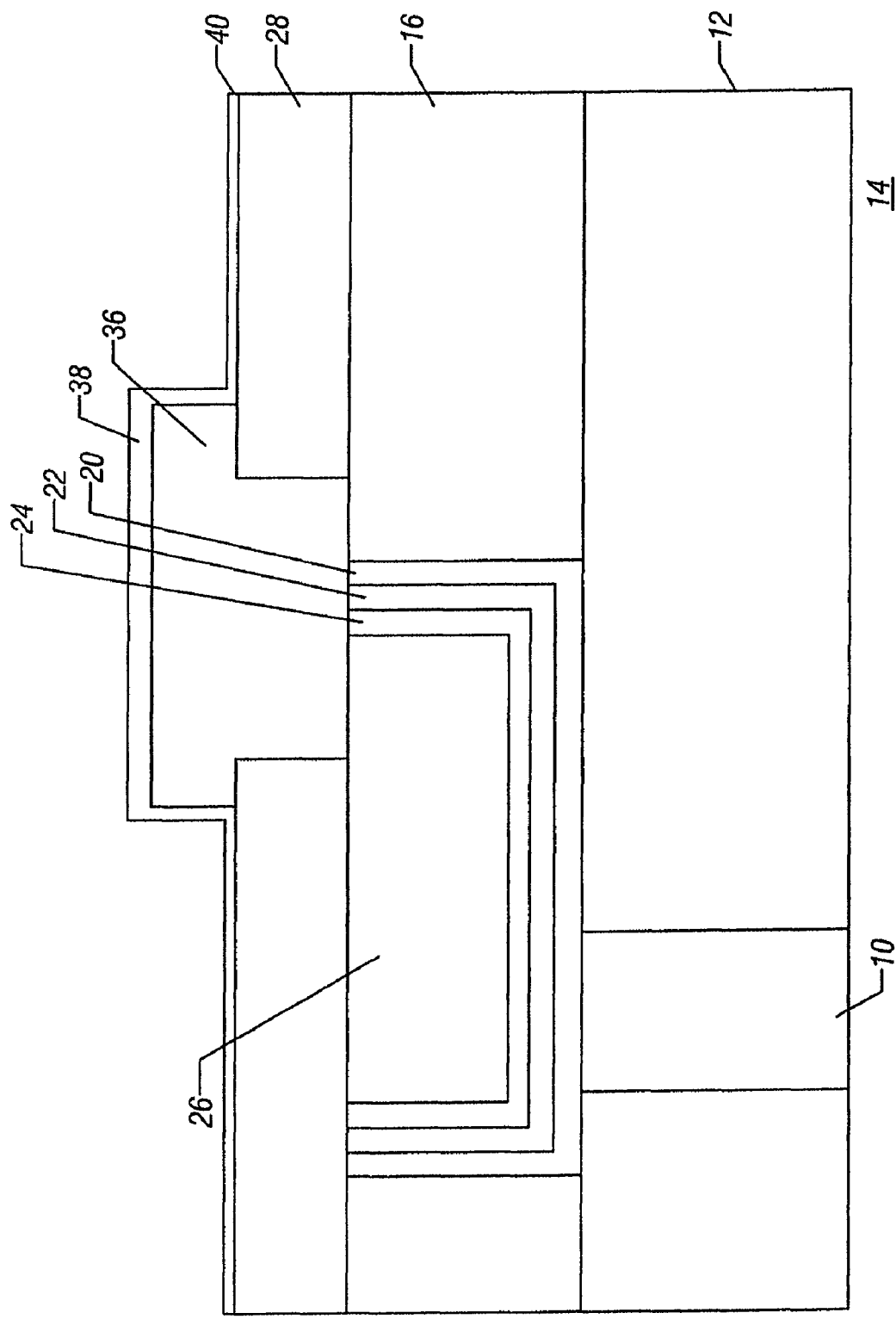
FIGS. 18-19 are cross-sectional views analogous to FIGS. 2-11, in final stages of manufacture.

Referring to FIGS. 17 and 18, a second cap layer 40 is then deposited over the first cap layer 38 and over the layer 28. In the present embodiment, the second cap layer 40 is formed of the same material as the first cap layer 38, thus, on top of the first cap layer 38 only reference number 38 is used.

Figure 19:
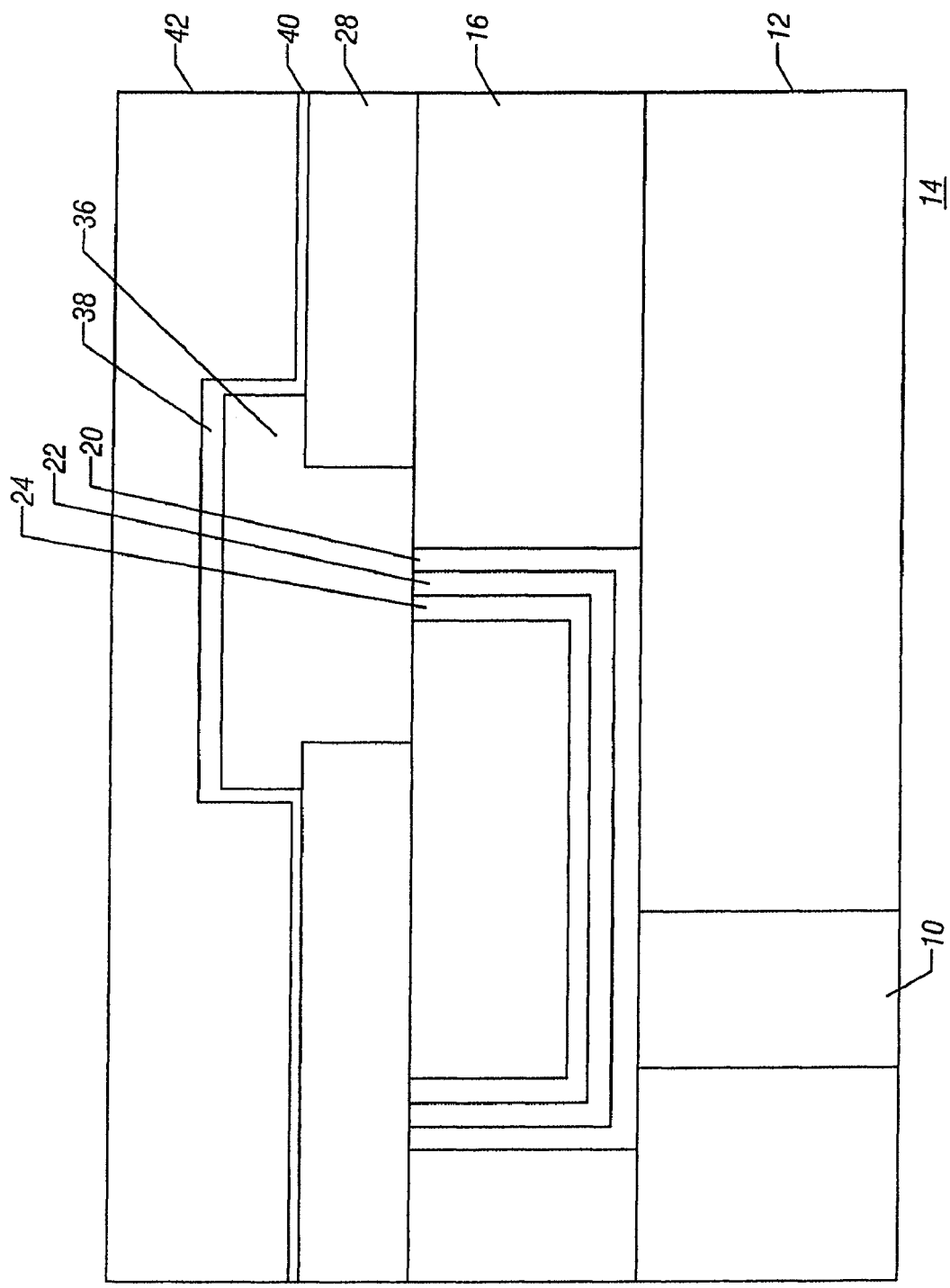

Referring to FIG. 19, an HDP oxide 42 is deposited; thereafter the entire structure is subjected to chemical mechanical planarization and the upper contact 44 is formed using conventional via formation techniques, thereby obtaining the structure of FIG. 1. The contact 44 may be formed of the same material as the contact 10.

Programming of phase change material 36 to alter the state or phase of the material may be accomplished by applying voltage potentials to electrodes 20 and 24, thereby generating a voltage potential across the material 36. When the voltage potential is greater than the threshold voltage of the device 50, then an electrical current flows through memory material 36 in response to the applied voltage potential, and results in heating memory material 36.

This heating alters the memory state or phase of memory material 36 and thus the electrical characteristic of memory material 36, e.g., the resistance of the material is altered by altering the phase of the memory material 36. Thus, memory material 36 may also be referred to as a programmable resistive material.

In the "reset" state, memory material 36 is in an amorphous or semi-amorphous state and in the "set" state, memory material 36 is in a crystalline or semi-crystalline state. The resistance of memory material 36 in the amorphous or semi-amorphous state is greater than the resistance of memory material 36 in the crystalline or semi-crystalline state. It is to be appreciated that the association of reset and set with amorphous and crystalline states, respectively, is a convention and that at least an opposite convention may be adopted.

Using electrical current, memory material 36 may be heated to a relatively higher temperature to amorphosize memory material 36 and "reset" memory material 36 (e.g., program memory material 36 to a logic "0" value). Heating the volume of memory material 36 to a relatively lower crystallization temperature crystallizes memory material 36 and "sets" memory material 36 (e.g., programs memory material 36 to a logic "1" value). Various resistances of memory material 36 may be achieved to store information by varying the amount of current flow and duration through the volume of memory material 36.

Figure 20:
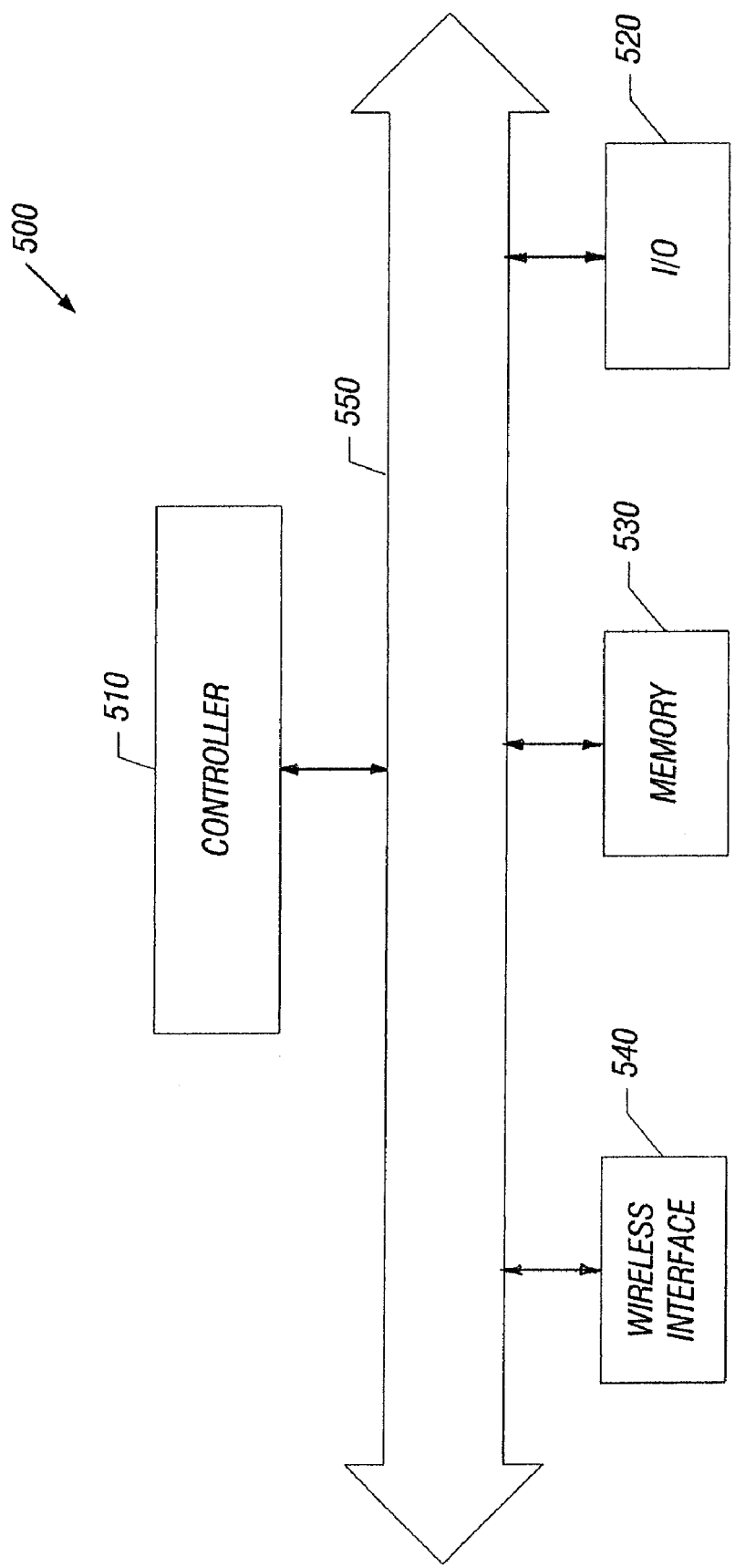
FIG. 20 is a system depiction of one embodiment of the present invention.

Finally, referring to FIG. 20, a system is depicted. System 500 includes a controller 510, an input/output (I/O) device 520 (e.g., a keypad, display), a memory 530, and a wireless interface 540 coupled to each other via a bus 550. It should be noted that the scope of the present invention is not limited to embodiments having all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by a memory such as memory 50 discussed herein.

I/O device 520 may be used by a user to generate a message. System 500 uses wireless interface 540 to transmit and receive messages to and from a wireless communication network with a radio frequency (RF) signal. Examples of a wireless interface 540 include an antenna or a wireless transceiver, although the scope of the present invention is not limited in this respect.

Finally, it is clear that numerous variations and modifications may be made to the phase change memory and method described and illustrated herein, all falling within the scope of the invention as defined in the attached claims. All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

The invention claimed is:
1. A method, comprising:
   making a phase change memory cell, the making including:
      forming an opening in an insulating layer;

forming spaced, distinct first and second electrodes having substantially co-planar surfaces, wherein forming the first electrode includes depositing said first electrode on said insulating layer in said opening;
depositing an insulator on said first electrode, wherein forming the second electrode includes depositing said second electrode on said insulator; and
forming a phase change material region including a single planar surface directly on said first and second electrode surfaces without including phase change material laterally between the first and second electrodes.

2. The method of claim 1, including forming the first and second electrodes as cup-shaped electrodes.

3. The method of claim 2, including forming the phase change material region over and in contact with said surfaces.

4. The method of claim 1, including forming said electrodes of the same material.

5. The method of claim 1, including forming both electrodes before forming said phase change material region.

6. The method of claim 1, including encapsulating said phase change material region in thermal insulating material with the exception of said electrodes that contact said phase change material region.

7. The method of claim 1, including covering said phase change material region with a cap layer to prevent poisoning of said phase change material region during processing.

8. The method of claim 1, including forming an insulating film between the first and second electrodes.

9. A method, comprising:
making a phase change memory cell, the making including:
forming spaced, distinct first and second electrodes having substantially co-planar surfaces; and
forming a phase change material region including a single planar surface directly on said first and second electrode surfaces without including phase change material laterally between the first and second electrodes; and
forming first and second conductive contacts, wherein forming said spaced, distinct first and second electrodes includes:
forming the first electrode with a vertical portion and a horizontal base and contacting said horizontal base with the first conductive contact; and
forming the second electrode with a vertical portion and a horizontal base and contacting said horizontal base of the second electrode with the second conductive contact.

10. A method comprising: making a phase change memory cell, the making including: forming spaced, distinct first and second electrodes having substantially co-planar surfaces; and forming a phase change material region including a single planar surface directly on said first and second electrode surfaces without including phase change material laterally between the first and second electrodes, wherein forming said spaced, distinct first and second electrodes includes: forming insulating layer having a top surface and a sidewall; forming a first conductive film having a top surface portion extending on the top surface of the insulating layer and a sidewall portion extending on the sidewall of the insulating layer; forming an insulating film having a top surface portion extending on the top surface portion of the first conductive layer and a sidewall portion extending on the sidewall portion of the first conductive layer; forming a second conductive film having a top surface portion extending on the top surface of the insulating film and a sidewall portion extending on the sidewall of the insulating film; removing the top surface portions of the insulating film and the first and second conductive films, the first electrode including the sidewall portion of the first conductive film and the second electrode including the sidewall portion of the first conductive film.

11. A method of making a phase change memory, comprising:
forming a first conductive contact;
forming a first electrode having a first portion extending in a first direction and second portion extending in a second direction transversely to the first portion, the second portion contacting the first contact;
forming a second electrode having a first portion extending substantially parallel to the first direction and second portion extending substantially parallel to the second direction, the first and second electrodes having substantially co-planar surfaces and being spaced apart from each other;
forming a phase change material region over and in contact with said surfaces; and
forming a second conductive contact in contact with the second portion of the second electrode.

12. The method of claim 11, wherein the first and second electrodes are cup-shaped, the method further including forming a cup-shaped insulating layer between the first and second electrodes.

13. The method of claim 11, including:
forming a first dielectric layer;
forming the first conductive contact extending into the first dielectric layer, the first conductive contact having a top surface;
forming a second dielectric layer on the first dielectric layer;
forming the first electrode in an aperture extending through the second dielectric layer;
forming an insulating layer on the first electrode;
forming the second electrode on the insulating layer; and
forming the second contact directly on a top surface of the second electrode.

14. The method of claim 11, including forming the first and second electrodes as cup-shaped electrodes.

15. The method of claim 11, including forming both electrodes before forming said phase change material region.

16. A method of making a phase change memory comprising:
forming spaced first and second electrodes having substantially co-planar surfaces; and
forming a phase change material region on said surfaces, wherein forming the first and second electrodes includes:
forming an opening in an insulating layer;
depositing said first electrode on said insulating layer in said opening;
depositing an insulator on said first electrode in said opening; and
depositing said second electrode on said insulator in said opening.

17. The method of claim 16, wherein depositing said first electrode includes:
depositing a conductive layer in the opening and on a top surface of said insulating layer; and
etching away a top portion of the conductive layer from the top surface of said insulating layer, thereby forming the first electrode in the opening and exposing the surface of the first electrode that is co-planar with the corresponding surface of the second electrode.

18. The method of claim 16, including forming the first and second electrodes as cup-shaped electrodes.

19. The method of claim 18, including forming the phase change material region over and in contact with said surfaces.

20. The method of claim 16, further comprising forming first and second conductive contacts, wherein forming said spaced first and second electrodes includes:
   forming the first electrode with a vertical portion and a horizontal base and contacting said horizontal base with the first conductive contact; and
   forming the second electrode with a vertical portion and a horizontal base and contacting said horizontal base of the second electrode with the second conductive contact.

21. The method of claim 16, including forming said electrodes of the same material.

22. The method of claim 16, including forming both electrodes before forming said phase change material region.

23. The method of claim 16, including encapsulating said phase change material region in thermal insulating material with the exception of said electrodes that contact said phase change material region.

24. The method of claim 16, including covering said phase change material region with a cap layer to prevent poisoning of said phase change material region during processing.

* * * * *